United States Patent [19]

Suzuki et al.

[11] 4,332,174

[45] Jun. 1, 1982

[54] LOAD-CELL BALANCE

[75] Inventors: Seiji Suzuki; Kohichiro Sakamoto; Tohru Kitagawa, all of Shizuoka, Japan

[73] Assignee: Tokyo Electric Company, Limited, Meguro, Japan

[21] Appl. No.: 139,644

[22] Filed: Apr. 14, 1980

[30] Foreign Application Priority Data

Apr. 19, 1979 [JP] Japan .................................. 54-47243
Apr. 20, 1979 [JP] Japan ............................ 54-53784[U]

[51] Int. Cl.³ .............................................. G01L 1/22
[52] U.S. Cl. ................... 73/862.65; 73/862.67; 177/211
[58] Field of Search ................ 73/141 A, 726, 862.63, 73/862.65, 862.67; 177/211; 338/5

[56] References Cited

U.S. PATENT DOCUMENTS

| 3,520,191 | 7/1970 | Pien | 73/726 |
| 4,196,784 | 4/1980 | Suzuki et al. | 177/211 |
| 4,217,785 | 8/1980 | Spoor | 73/766 |

FOREIGN PATENT DOCUMENTS 2600925  7/1977  Fed. Rep. of Germany ........ 73/726

Primary Examiner—Charles A. Ruehl
Attorney, Agent, or Firm—Oblon, Fisher, Spivak, McClelland & Maier

[57] ABSTRACT

A load-cell balance in which strain gauges are mounted on a recess portion of the flexible arms of the balance. The circuitry for the strain gauges is mounted on a printed circuit board which is fixed to the stationary portion of the balance and extends along the length of the flexible beams. An electrically shielding cover may be provided for the load balance, as well as compensating resistances.

8 Claims, 12 Drawing Figures

LOAD-CELL BALANCE

BACKGROUND OF THE INVENTION

The present invention relates to a load-cell balance using a strain gauge.

The typical conventional load-cell balance of the kind described has a stationary portion fixed to a base, a movable portion to which a load support is connected and a pair of arms connected between the stationary and movable portions, the stationary portion, movable portion and two arms in combination forming a quadrilateral beam. The balance further has four strain gauges adhered to thin-walled flexible portions formed at both ends of each arm. These four strain gauges are connected to form a bridge circuit such that an electric signal corresponding to the load is derived from the bridge circuit.

Needless to say, in the load cell balance of the type described, it is necessary to process the beam as the mechanical constituent with high precision. In addition, since the balance involves electrical connection, the stability of the electrical connection is an essential factor.

The positions of the strain gauges are naturally determined, and the connection has to be made independently to each strain gauge by means of a lead. In the conventional load-cell balance, it is not possible to definitely fix the position of a lead, because the leads are derived independently from a circuit provided on the stationary part. In addition, electrical interference between the leads is inevitably caused, resulting in an unstable measurement. Further, the characteristic of the balance is changed by external force. The measurement is unstabilized also by the change in temperature of the strain gauge attributable to the ambient air flow. The lead wires exposed to the outside are likely to be damaged or cut. Moreover, the greatest care is required in handling of the balance so as not to damage the strain gauge adhered to the flexible portions of the arms and exposed to the outside of the beam.

The characteristic of the strain gauge is largely affected also by humidity, so that measures for protecting the gauge against the humidity are indispensable.

The desired effect cannot be achieved solely by connecting the strain gauges in the form of a bridge. Namely, it is necessary to connect other electric parts such as compensation resistors and the like. The connection has to be made in the circuit part resulting in a difficulty in adjustment.

SUMMARY OF THE INVENTION

It is, therefore, a first object of the invention to provide a load-cell balance which permits a firm and stable connection of electric wires to the strain gauges which are mounted remotely from one another at the flexible portions of the beam.

It is a second object of the invention to provide a load-cell balance which permits an adjustment of characteristic by mechanically processing the flexible parts of the beam even after the adhesion of the strain gauges to these flexible parts.

It is a third object of the invention to provide a load-cell balance having electric wiring capable of eliminating the generation of noise.

It is a fourth object of the invention to provide a load-cell balance which is constructed to prevent the breaking or cutting of the lead wires of the strain gauge.

It is a fifth object of the invention to provide a load-cell balance in which precision parts such as strain gauges are mechanically protected and error of measurement due to air flow is prevented.

It is a sixth object of the invention to provide a load-cell balance in which strain gauges are protected against moisture.

It is a seventh object of the invention to provide a load-cell balance in which strain gauges attached to the beam are located in a recess so as to be protected against external force.

It is an eighth object of the invention to provide a load-cell balance which is constructed to permit an easy connection of compensation resistors for the strain gauges.

DESCRIPTION OF THE PREFERRED EMBODIMENT

Figure 1:
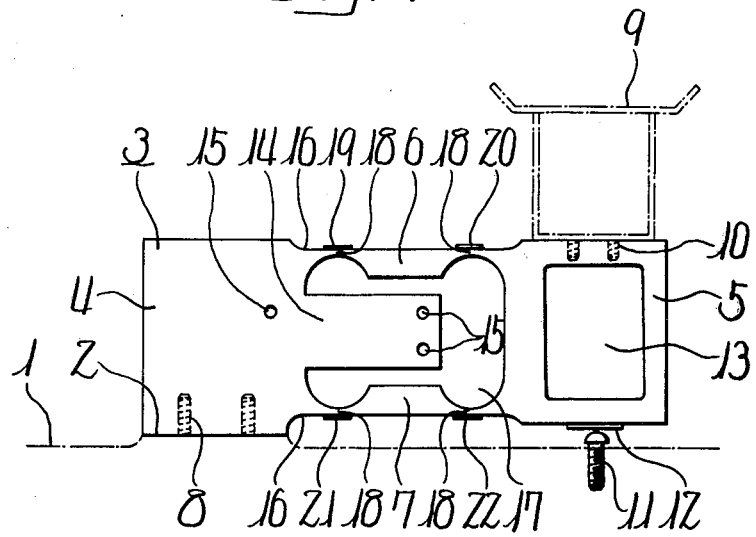
FIG. 1 is a front elevational view of a beam member incorporated in a load-cell balance constructed in accordance with an embodiment of the invention.

Hereinafter, a preferred embodiment of the invention will be described with reference to the accompanying drawings. Referring first to FIG. 1, a reference numeral 1 denotes a base provided at its portion on the top surface thereof with a attaching bracket 2 formed to project therefrom. Also, provided is a beam 3 having a rectangular shape and a predetermined thickness. The beam 3 is made of an alluminum alloy such as Duralmin. More specifically, the beam has a stationary portion 4 and a movable portion 5 which are unitarily connected to each other at their upper and lower sides through arms 6 and 7. Thus, the stationary portion 4, movable portion 5, and arms 6,7 in combination constitute a parallelogram. Also the stationary part 4 is provided with an attaching bore which is adapted to be screwed to the attaching bracket 2. Also, an attaching bore 10 for connection with a load support 9 is formed in the upper surface of the movable part 5, while to the lower surface of the movable portion 5 is attached a supporting plate 12 made of a hard material such as iron and adapted to be opposed by a stopper 11 provided by an adjusting screw on the base 1. Also, an opening 13 is formed in the side portion of the movable portion 5 in order to reduce the mass of the beam. A cantilevered projection 14 is formed on the stationary portion 4 so as to project toward the movable portion 5. Attaching bores 15 are formed in the end portion of this projection 14 and the stationary portion 4. This projection may be formed of a different material from that of the stationary portion 4 and fixed to the latter. The upper and lower faces of the beam are recessed at their mid portions as at 16. Also, an opening or aperture 17 of a special shape is formed in the side portion of the beam to extend through the thickness of the beam. These recesses 16 and the aperture 17 in combination provide two thin-walled flexible portions 18 in each arm 6,7. In the illustrated embodiment, the aperture 17 has a substantially H-shaped form constituted by two parallel elliptic bores having vertical major axes and spaced laterally from each other, and a transverse bore interconnecting these elliptic bores. Consequently, each thin-walled flexible portion has a curved inner surface, and the flexible parts 18 are located at the corner portions of the parallelogram.

Figure 8:
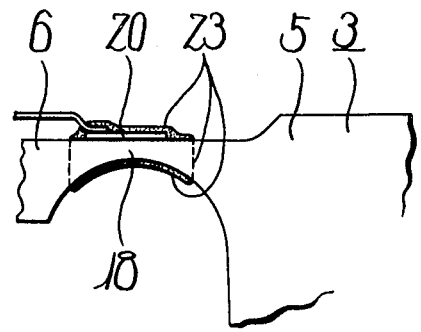
FIG. 8 is an enlarged front elevational view showing a part of the load-cell balance of the invention.

Strain gauges 19,20,21,22 are adhered to the outer surfaces of the flexible portions 18. The strain gauges 19-20 and the corresponding flexible portions 19-20 are perfectly enclosed in a sealing manner by means of a thin rubber layer 23 made of silicon rubber or butyl rubber. (See FIG. 8) This arrangement provides a sufficient seal against the moisture and makes the load caused by mechanical deformation negligibly small.

Figure 2:
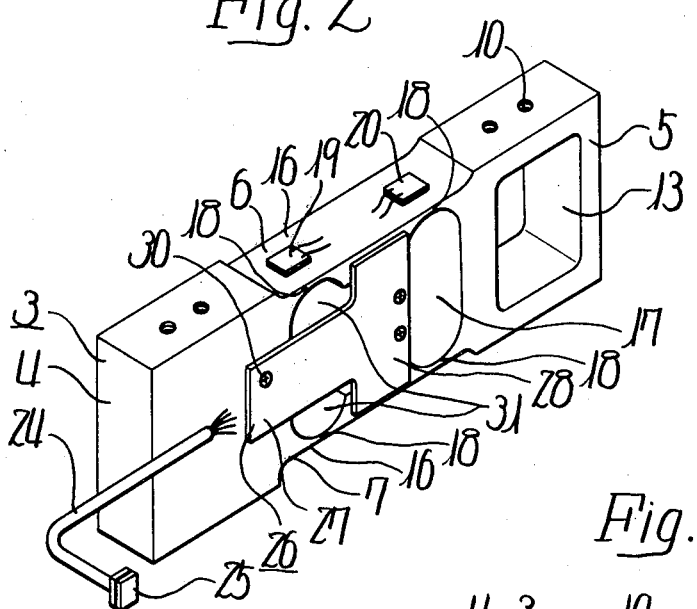
FIG. 2 is a perspective view of the beam member.
Figure 3:
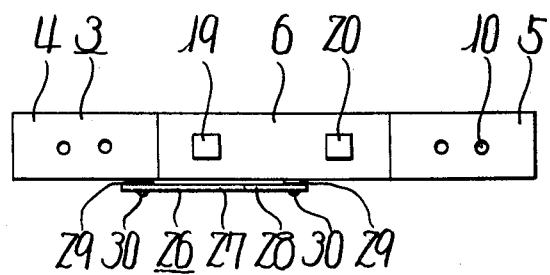
FIG. 3 is a plan view of the beam member.
Figure 4:
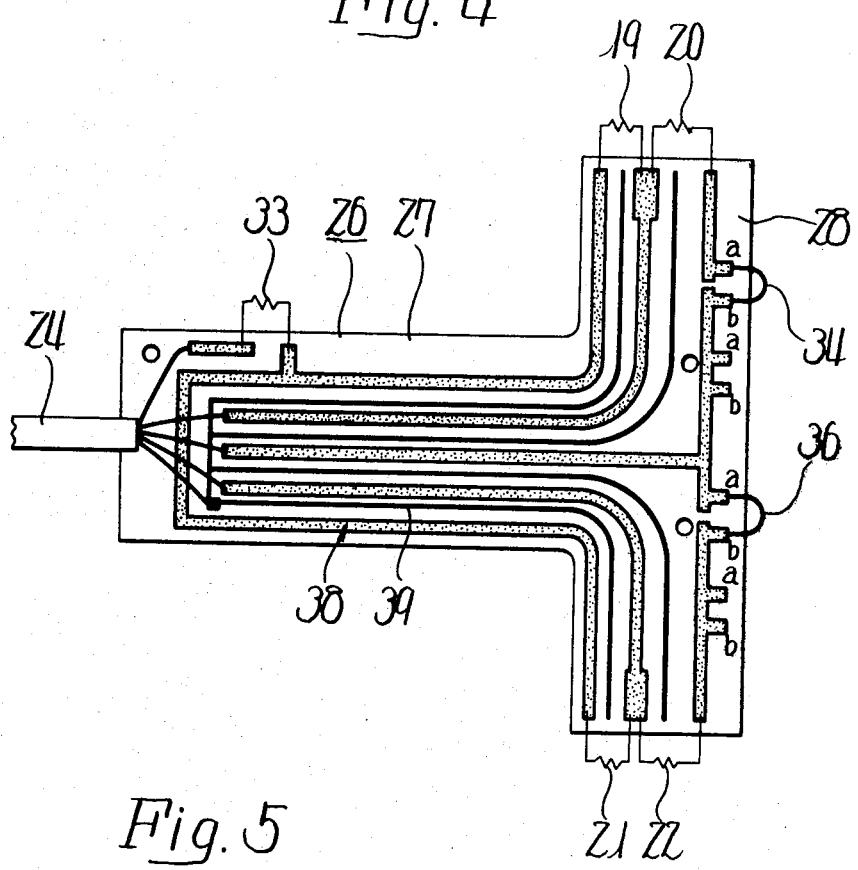
FIG. 4 is a front elevational view of a printed circuit board showing in a larger scale the obverse side of the printed circuit board.
Figure 5:
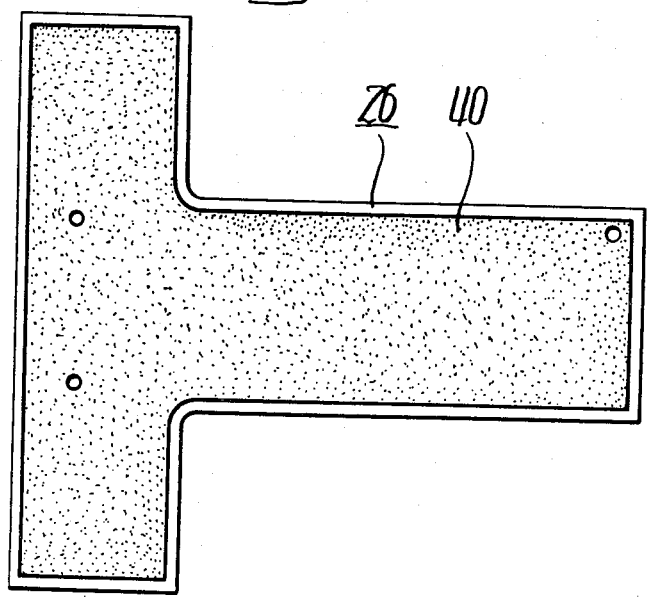
FIG. 5 is a bottom plan view of the printed circuit board showing in a larger scale the reverse side of the printed circuit board.
Figure 6:
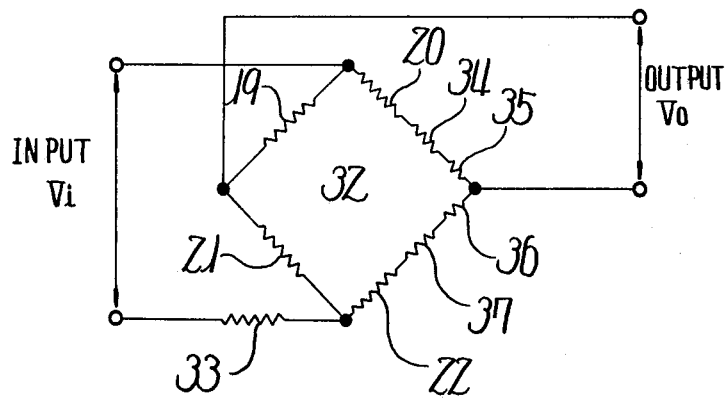
FIG. 6 is a circuit diagram of a bridge circuit.
Figure 9:
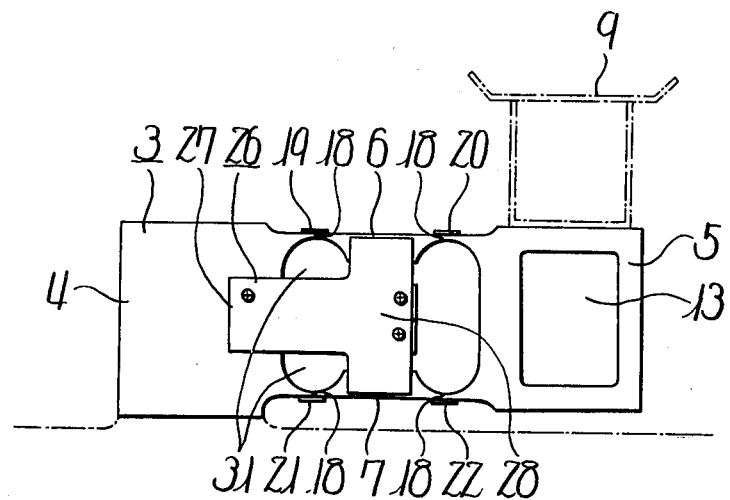
FIG. 9 is a front elevational view of a load-cell balance as a whole.

Referring now to FIGS. 2 and 3, a printed circuit board 26 is connected to the strain gauges 19-20 and is provided with a cord 24 having a connector 25. This printed circuit board 26 has a substantially T-shape with a horizontal portion 27 extending along the projection 14 and a vertical portion 28 extending from the end of the horizontal portion 27 toward the mid portions of the arms 6,7. This T-shaped printed circuit board is secured by means of screws 30 which engage the aforementioned attaching bores 15 at a suitable distance from the beam 3 with a spacer 29 interposed therebetween. Since this printed circuit board 26 has a T-shape extending to the mid portion of the aperture 17, it leaves spaces 31 for making the inner surfaces of the flexible portions 18 accessible. (See FIGS. 2 and 9)

The strain gauges 19-22 are connected in such a manner as to form a bridge circuit 32 to the input side of which is connected a resistor 33 which is made of nickel foil and referred to as span resistance. Compensation resistors 34,35,36,37 are connected between the strain gauges 20,22. The resistor 33 is adapted to compensate for the change of Young's modulus of the beam 3 caused by a change of temperature. The compensation resistors 34-37 are used for the compensation of the bridge circuit. Manganin wire is used for the compensation of the zero balance, whereas copper wire is used for the compensation of the temperature coefficient of the zero balance.

Figure 7:
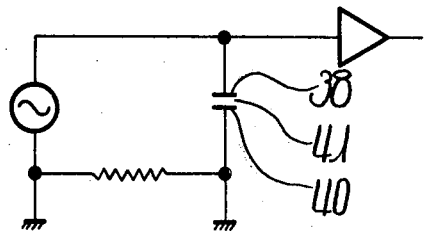
FIG. 7 is a circuit diagram of an equivalent circuit.

A wiring pattern 38 satisying the above-requisites is formed by means of copper foil on the surface of the printed circuit board. A pattern 39 for preventing electric interference such as electrostatic induction between the parts of the pattern 38 is formed in the latter. Further, connecting portions a and b for connecting the compensation resistors 34-37 are formed in a part of the wiring pattern 38. Also, to the reverse side of the printed circuit board 26, is formed a shield pattern 40 grounded to the beam 3 so as to entirely cover the copper foil, disposed in a network-like form. Thus, as shown in FIG. 7, a capacitor 41 is constituted by the wiring pattern 38 and the shield pattern 40 thereby to provide an equivalent circuit.

Figure 12:
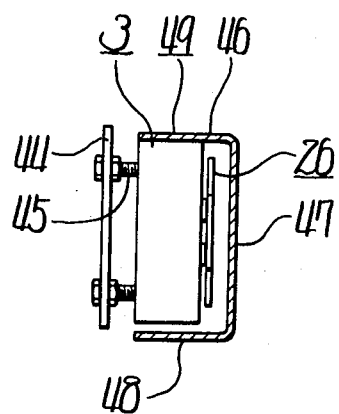
FIG. 12 is a side elevational view with only the cover sectioned.

As will be seen from FIG. 12, a printed circuit board 44 is fixed to the opposite side of the stationary portion 4 of the beam 3 from the printed circuit board 26, by means of screws 45. This printed circuit board 44 is adapted to be connected to the first-mentioned printed circuit board 26 by means of the aforementioned cord 24.

Figure 11:
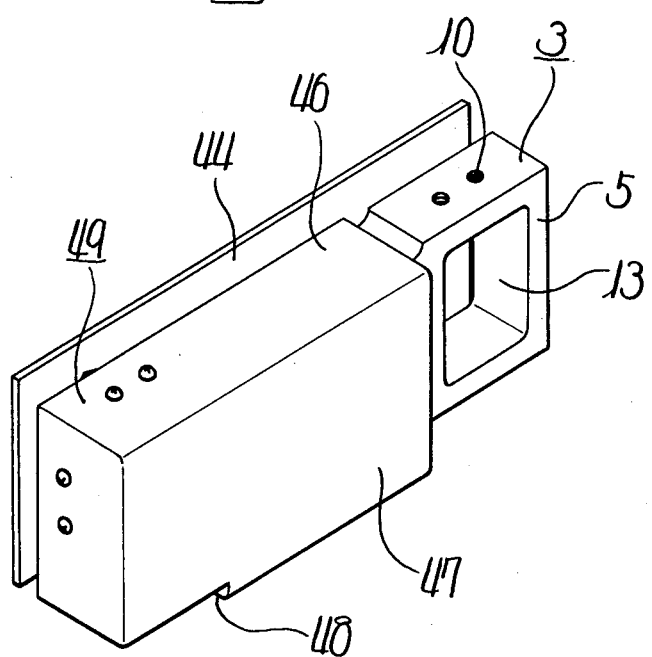
FIG. 11 is a perspective view of a beam to which attached is a cover.

It will be understood from FIGS. 11 and 12 that a cover 49 fixed by screws to the stationary portion 4 has an upper plate 46 covering the stationary portion 4 and arm 6, side plate 47 for covering the stationary part 4 and one side of the arms 6,7 and a lower plate 48 for underlying the lower face of the arm 7.

According to this arrangement, as an object is placed on the load support 9, the movable portion 5 is moved downward deflecting the flexible portions 18. In consequence, the strain gauges 19-22 produce respective electric signals in accordance with the degrees of deflections, so that the weight of the object is measured electrically by using these electric signals. The movable portion 5 opposes the stationary portion 4 in parallel with the latter along a vertical axis, and is supported by arms which are extended in parallel with each other from the stationary portion 4. In addition, the flexible parts 18 are located at corner portions of the parallelogram. For these reasons, the beam 3 itself has a Roberbal function. Namely, even if an eccentric load is applied to the load support 9, the load is corrected into the vertical load applied to the beam 3, so that the weight measurement is made with high precision. In addition, since a separate Roberbal mechanism is not required, the number of parts is reduced and the construction is made simple and compact. In addition, assembling and adjusting operations are facilitated. The strain gauges 19-22 are located in the recesses 16 so as to be retracted from the upper, lower and both side surfaces of the beam 3 and, therefore, are protected against any mechanical damaging force.

The stopper 11 supporting the beam 3 effectively protects the flexible portions 18 against overload which would, otherwise, cause extraordinary deformation of the flexible portions 18. In this case, the beam is formed of aluminum. However, no indentation is formed nor wear is caused in the beam 3 because the portion of the beam 3 opposed by the stopper 11 is provided with a support plate 12. The aperture 13 formed in the movable portion 5 of the beam decreases the mass to reduce the impact caused during transportation or falling. These arrangements, therefore, prevent the extraordinary deformation of the flexible portions 18. The aperture 13 can have various forms such as a circular form, oval form, polygonal form and so forth. If it is formed by a bore, it is possible to provide desired thicknesses to the upper, lower and side portions. This construction offers, in combination with the support provided by the stopper 11, a sufficient mechanical strength of the beam 3 although the latter is made of aluminum.

In addition, since the strain gauges 19-22 are sealed together with the associated flexible portions 18, the flexible portions 18 and the strain gauges 19-22 are protected against damaging atmosphere or moisture, and the sensitive flexible portions 18 are prevented from being corroded.

The printed circuit board 26 has a vertical portion 28 which is supported at its one end by the stationary portion 4 and at the other end by the projection 14 projecting from the stationary portion 4 to the mid portions of the arms 6,7. This arrangement conveniently permits one to reduce the length of the lead wires to the strain gauges 19-22, so that the lead wires can easily be placed in order, avoiding mutual mechanical interference. In addition, since the end portion is also fixed to the end of the projection 14 by means of screws 30 engaging the attaching bores 15, the undesirable warp of the printed circuit board, which may cause a breakage of the lead wires for the strain gauges 19-22, is avoided completely. Further, since the printed circuit board 26 extending to the mid portions of the arms 6,7 is spaced by the spacer 29 from the arms 6,7 which deflect up and down, it never causes friction which would hinder the free deflection of these arms 6,7. This also contributes to the enhancement of precision of the measurement.

On the printed circuit board 26, the wiring pattern 38 of the bridge circuit 32 formed on the obverse side of the printed circuit board 26 and the shield pattern 40 formed on the reverse side and grounded to the beam 3 in combination constitute a capacitor 41 which provides a by-pass passage for releasing high-frequency induction noises or the like. It is, therefore, possible to take out the mechanical load precisely in the form of an electric signal.

The wiring and adjustment of the resistors can be made easily thanks to the connecting portions a and b for connecting the compensation resistors 34-37 for compensating zero balance of the bridge circuit 32 and the temperature coefficient of the zero balance.

For instance, compensation resistors 34,36 for compensation of the zero balance are made of manganin wires of 0.1 mm dia. and coated with polyurethane. These compensation resistors 34,36 are connected to the connecting portions a,b by soldering, and the copper foil constituting the wiring pattern between the portions a and b is cut away. The adjustment of the resistance value can be made by materially changing the length of the resistor 34 through changing the padding of the solder.

Figure 10:
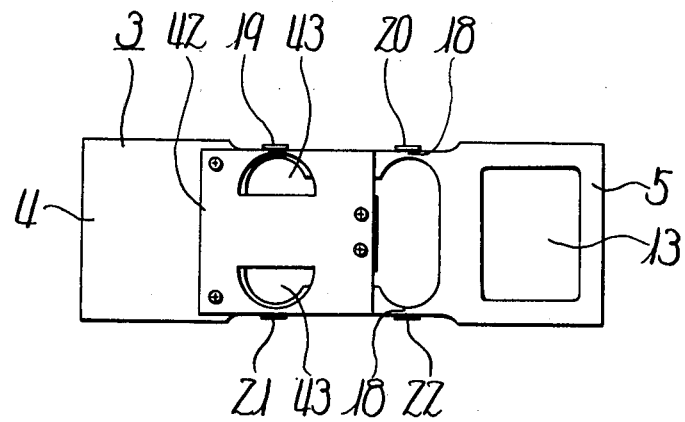
FIG. 10 is a front elevational view of a modification.

The printed circuit board 26 extends to the mid portions of the arms 6,7 but leaves the spaces 31 for making the inner sides of the flexible portions 18 accessible. Therefore, the adjustment of the mechanism can be made without substantial difficulty by cutting the inner surfaces of the flexible portions 18 by means of a hand grinder or the like. When a square printed circuit board 42 as shown in FIG. 10 is used, the spaces 43 for making the inner surfaces of the flexible portions accessible are formed by means of a D-shaped aperture, aperture of another shape or a notch.

Furthermore, it is quite advantageous that the thin-walled portions 18, strain gauges 19-22 and so forth are protected against mechanical external force by the cover 49. The cover 49 also shields its strain gauges 19-22 and the printed circuit board 26 from the ambient air flow, so that the ambient temperature and resistance values and, hence, the operations of the strain gauges and compensation resistors 34-37 are stabilized. Further, the cover 49 made of a metal plate enclosing the major part of the beam 3 is grounded to the beam 3 which in turn is grounded to the base 1. As a result, electric noises are released to the base 1 to permit a further enhancement of the measuring precision. In this case, the movement of the movable portion 5 and the arms 6,7 is never hindered by the cover 49, because the cover 49 is arranged to avoid mechanical interference with the movable or deflectable parts.

What is claimed as new and desired to be secured by Letters Patent of the United States is:

1. A load-cell balance comprising: a parallelogram beam including a stationary portion fixed to a base, a movable portion to which a load support is coupled and a pair of parallel arms through which said stationary and movable portions are connected to each other at their upper and lower ends, said arms having flexible portions; strain gauges adhered to said flexible portions; and a printed circuit board to which a wiring pattern for said strain gauges is adhered, said printed circuit board extending along the length of said beam and being fixed at one end to said stationary portion.

2. A load-cell balance as claimed in claim 1, wherein said printed circuit board extends from said stationary portion substantially to the mid portions of said flexible portions.

3. A load-cell balance comprising: a parallelogram beam including a stationary portion fixed to a base, a movable portion to which a load support is coupled and a pair of parallel arms through which said stationary and movable portions are connected to each other at their upper and lower ends, said arms having flexible portions; strain gauges adhered to said flexible portions; and a printed circuit board to which a wiring pattern for said strain gauges is adhered, said printed circuit board extending along the length of said beam and being fixed at one end to said stationary portion, said printed circuit board having at its reverse side a shield pattern which is grounded through said beam and forming a capacitor in cooperation with said wiring pattern.

4. A load-cell balance comprising: parallelogram beam including a stationary portion fixed to a base, a movable portion to which a load support is coupled and a pair of parallel arms through which said stationary and movable portions are connected to each other at their upper and lower ends, said arms having flexible portions; strain gauges adhered to said flexible portions; and a printed circuit board to which a wiring portion for said strain gauges is adhered, said printed circuit board extending along the length of said beam and being fixed at one end to said stationary portion, said stationary portion having a projection unitarily projecting therefrom, said printed circuit board having the end opposite said one end fixed to said projection.

5. A load-cell balance comprising: a parallelogram beam including a stationary portion fixed to a base, a movable portion to which a load support is coupled and a pair of parallel arms through which said stationary and movable portions are connected to each other at their upper and lower ends, said arms having flexible portions; strain gauges adhered to said flexible portions; and a printed circuit board to which a wiring pattern for said strain gauges is adhered, said printed circuit board extending along the length of said beam and being fixed at one end to said stationary portion, said balance further comprising a cover made of metal plates and adapted to cover said beam and said printed circuit board except said movable portion, said cover being electrically grounded and fixed to said stationary portion.

6. A load-cell balance comprising: a parallelogram beam including a stationary portion fixed to a base, a movable portion to which a load support is coupled and two parallel arms through which said stationary and movable portions are connected to each other at their upper and lower ends, said arms having flexible portions; strain gauges adhered to said flexible portions; a rubber layer sealing each strain gauge together with the associated flexible portion; and a printed circuit board having a wiring pattern for these strain gauges, said printed circuit board extending along the length of said beam and fixed at one end to said stationary portion.

7. A load-cell balance comprising a parallelogram beam including a stationary portion fixed to a base, a movable portion to which a load support is coupled and two parallel arms through which said stationary and movable portions are connected to each other at their upper and lower portions, said arms having flat recesses recessed from the upper and lower surfaces of said stationary portion and said movable portion, said arms further having flexible portions formed in said recesses, strain gauges adhered to said flexible portions; and a printed circuit board having a wiring pattern for said strain gauges, said printed circuit board extending along the length of said beam and fixed at one end to said stationary portion.

8. A load-cell balance comprising a parallelogram beam including a stationary portion fixed to a base, a movable portion to which a load support is coupled and two parallel arms through which said stationary portion and said movable portion are connected to each other at their upper and lower ends, said arms having flexible portions; strain gauges adhered to said flexible portions; and a printed circuit board extending along said beam and fixed at one end to said stationary portion, said printed circuit board having a wiring pattern printed therein and including wirings for said strain gauges and connecting portions for connection with resistors for providing compensating resistance for said strain gauges.

* * * * *